(12) United States Patent
Damiani

(10) Patent No.: US 11,527,664 B2
(45) Date of Patent: *Dec. 13, 2022

(54) CONFIGURABLE SOLAR CELLS

(71) Applicant: Solar Inventions LLC, Smyrna, GA (US)

(72) Inventor: Benjamin Mark Damiani, Atlanta, GA (US)

(73) Assignee: Solar Inventions LLC, Smyrna, GA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/468,826

(22) Filed: Sep. 8, 2021

(65) Prior Publication Data

US 2022/0190176 A1    Jun. 16, 2022

Related U.S. Application Data

(63) Continuation of application No. 16/119,865, filed on Aug. 31, 2018, now Pat. No. 11,145,774.

(Continued)

(51) Int. Cl.
*H01L 31/047* (2014.01)
*H01L 31/0216* (2014.01)
(Continued)

(52) U.S. Cl.
CPC ........ *H01L 31/047* (2014.12); *H01L 31/0201* (2013.01); *H01L 31/02167* (2013.01);
(Continued)

(58) Field of Classification Search
CPC ............... H01L 31/047; H01L 31/0475; H01L 31/0201; H01L 31/02167; H01L 31/02168;
(Continued)

(56) References Cited

U.S. PATENT DOCUMENTS

| 4,323,719 A | 4/1982 | Green |
|---|---|---|
| 4,933,021 A | 6/1990 | Swanson et al. |

(Continued)

FOREIGN PATENT DOCUMENTS

| CN | 105340086 A | 2/2016 |
|---|---|---|
| WO | 2012108767 | 8/2012 |

OTHER PUBLICATIONS

Extended European Search Report dated Jan. 21, 2022 by the European Patent Office for corresponding European application No. 19810606.4; 11 pages.

(Continued)

*Primary Examiner* — Tamir Ayad
(74) *Attorney, Agent, or Firm* — Smith Gambrell & Russell LLP

(57) ABSTRACT

A photovoltaic cell may include a substrate configured as a single light absorption region. The cell may include at least one first semiconductor region and at least one second semiconductor region arranged on or in the substrate. The cell may include a plurality of first conductive contacts arranged on the substrate and physically separated from one another and a plurality of second conductive contacts arranged on the substrate and physically separated from one another. Each first conductive contact may be configured to facilitate electrical connection with the at least one first semiconductor region. Each second semiconductor conductive contact may be configured to facilitate electrical connection with the at least one second semiconductor region. Each of the first conductive contacts may form at least one separate cell partition with at least one of the second conductive contacts, thereby forming a plurality of cell partitions on or in the substrate.

18 Claims, 10 Drawing Sheets

Related U.S. Application Data

(60) Provisional application No. 62/677,934, filed on May 30, 2018.

(51) Int. Cl.
| | |
|---|---|
| H01L 31/05 | (2014.01) |
| H01L 31/02 | (2006.01) |
| H01L 31/0224 | (2006.01) |
| H01L 31/0352 | (2006.01) |
| H01L 31/0475 | (2014.01) |
| H01L 31/18 | (2006.01) |
| H02S 20/23 | (2014.01) |

(52) U.S. Cl.
CPC ............. *H01L 31/02168* (2013.01); *H01L 31/022433* (2013.01); *H01L 31/03529* (2013.01); *H01L 31/0475* (2014.12); *H01L 31/05* (2013.01); *H01L 31/18* (2013.01); *H02S 20/23* (2014.12)

(58) Field of Classification Search
CPC ....... H01L 31/022433; H01L 31/03529; H01L 31/05; H01L 31/18; H02S 20/23
See application file for complete search history.

(56) References Cited

U.S. PATENT DOCUMENTS

| 6,441,297 | B1 | 8/2002 | Keller |
|---|---|---|---|
| 7,999,174 | B2 | 8/2011 | Moslehi |
| 8,546,157 | B2 | 10/2013 | Gupta |
| 8,592,249 | B1 | 11/2013 | Nielson et al. |
| 9,130,076 | B2 | 9/2015 | Moslehi |
| 9,608,133 | B2 | 3/2017 | Park |
| 9,893,222 | B2 | 2/2018 | Harley et al. |
| 2002/0153039 | A1 | 10/2002 | Moon |
| 2004/0261839 | A1 | 12/2004 | Gee |
| 2008/0223429 | A1 | 9/2008 | Everett et al. |
| 2009/0266401 | A1 | 10/2009 | Stangl et al. |
| 2011/0000532 | A1 | 1/2011 | Niira et al. |
| 2013/0087192 | A1 | 4/2013 | Kim et al. |
| 2013/0167898 | A1 | 7/2013 | Hong |
| 2014/0326295 | A1 | 6/2014 | Moslehi |
| 2014/0209149 | A1 | 7/2014 | Mascarenhas et al. |
| 2015/0083186 | A1 | 3/2015 | Shibasaki et al. |
| 2015/0171240 | A1 | 6/2015 | Kapur et al. |
| 2015/0280028 | A1 | 10/2015 | Harley et al. |

OTHER PUBLICATIONS

Examination Report dated Mar. 22, 2022 by the Turkish Patent Office for corresponding Turkish Application No. 2020/19143; 9 pages.

First Office Action dated Dec. 6, 2021 by the Chinese Patent Office for corresponding Chinese application No. 2019800198066; 5 pages.

Eslamian et al., "Thermodiffusion Applications in MEMS, NEMS and solar cell fabrication by Thermal Metal Doping of Semiconductors," Fluid Dynamics and Material Processing, vol. 8, No. 4, pp. 353-380, 2012.

CONFIGURABLE SOLAR CELLS

CROSS-REFERENCE TO RELATED APPLICATION

This application claims priority from U.S. Provisional Application No. 62/677,934, entitled "ELECTRICAL POWER FLOW AND CONFIGURABLE POWER OUTPUT FOR PHOTOVOLTAIC CELLS WITH A COMMON ABSORBER REGION AND A PLURALITY OF PARTITIONED COLLECTING JUNCTIONS," filed May 30, 2018, the entirety of which is incorporated by reference herein

BRIEF DESCRIPTIONS OF THE DRAWINGS

DETAILED DESCRIPTION OF SEVERAL EMBODIMENTS

Some embodiments of the disclosed technology may enable the design, manufacturing, and production of semiconductor wafer photovoltaic cell(s) with configurable output current characteristics ("power characteristics") on a single, physically contiguous light absorbing wafer/substrate. Some embodiments of the disclosed technology may enable configurable power characteristics by creating multiple semi-electrically isolated collecting junctions on a single light absorbing wafer and electrically interconnecting the collecting junctions in parallel circuits, for example. Some embodiments of the disclosed technology may enable a plurality of physically isolated wafers, some or all with configurable power characteristics, to interconnect in a photovoltaic panel, module, or system, for example.

Figure 1:
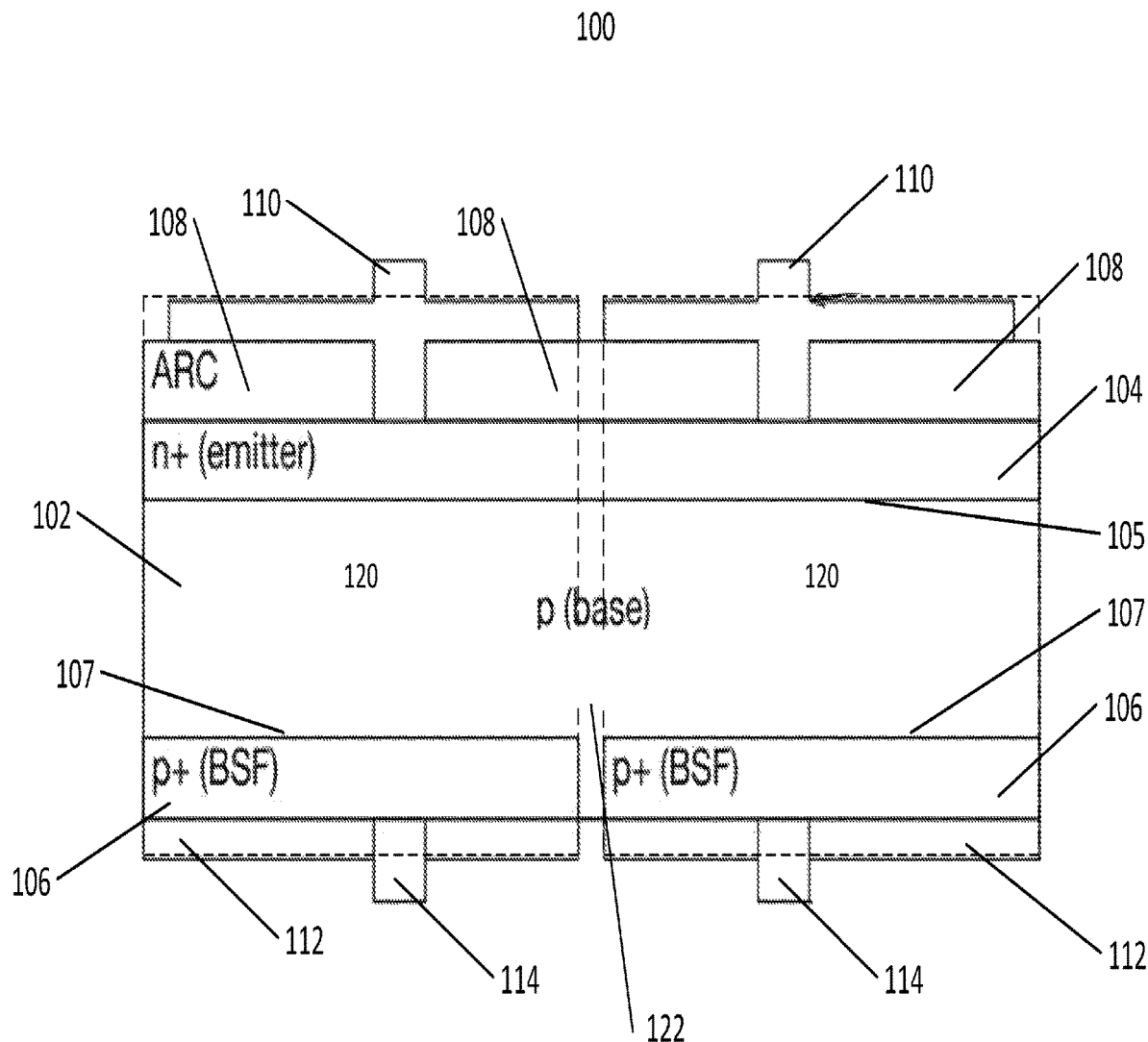
FIG. 1 is a cross-sectional view of a semiconductor wafer with cell partitions according to an embodiment of the disclosure.

FIG. 1 is a cross-sectional view of a semiconductor wafer 100 with cell partitions 120 according to an embodiment of the disclosure. Wafer 100 may be configured as a photovoltaic device, including base or light absorber region 102, emitter region 104, and back surface field region 106. Base region 102 and emitter region 104 may define a collector junction 105 therebetween. Base region 102 and back surface field region 106 may define a high-low junction 107 therebetween. Wafer 100 may include front silver (or other conductive material) bus bars 110 and/or rear silver (or other conductive material) bus bars 114. In wafer 100, cell partitions 120 may be defined by one or more functionally partitioned back surface field region(s) 106 and rear bus bars 114 with matching partitioned front bus bars and/or front grid fingers 110 on a single, physically contiguous light absorbing wafer/substrate 102 and single, physically contiguous emitter region 140. FIG. 1 illustrates two partitions 120, where each partition 120 is defined by separate overlapping front bus bar and/or front grid finger 110 and high-low junction 106 pairs.

Base region 102, emitter region 104, and back surface field region 106 may be semiconductor regions that are doped differently from one another to encourage photovoltaic activity therebetween. For example, as shown in FIG. 1, base region 102 may be made of a p type material, emitter region 104 may be made of an n+ type material, and back surface field region 106 may be made of a p+ type material. However, in other embodiments, the regions may be configured differently. For example, in some embodiments, base region 102 may be made of an n type material, emitter region 104 may be made of a p+ type material, and back surface field region 106 may be made of an n+ type material. In some embodiments, base region 102 may be made of an n type material, emitter region 104 may be made of an n+ type material, and back surface field region 106 may be made of a p+ type material. In some embodiments, base region 102 may be made of an n type material, emitter region 104 may be made of a p+ type material, and back surface field region 106 may be made of an n+ type material.

Wafer 100, and other wafers described herein, may be regarded as a single photovoltaic cell in some embodiments. Wafer 100 may be configured using a photovoltaic cell technology such as aluminum back surface field (Al-BSF). For example, in addition to base/light absorber region 102, emitter region 104, and back surface field regions 106, wafer 100 may include back aluminum (or other conductive material) contacts 112 which may be functionally partitioned corresponding to each partitioned back surface field region 106. Wafer 100 may include an anti-reflective coating 108 which may be partitioned or may be continuous.

The partitions 120 may share a common base/bulk region which may serve as light absorber region 102 and/or a common emitter region 104. The common light absorber region (base/bulk region) 102 and/or common emitter region 104 may maintain the physical connection for the isolated partitions 120. FIG. 1 demonstrates one embodiment that semi-electrically isolates partitions 120 by leaving an undoped bulk material region 122, and/or non-silicon region such as an edge and/or airgap, between portions of partitions 120 and/or leaving an airgap between contact portions of partitions 120. Other embodiments may provide improved performance for series connected partitions 120 by configuring the depth and width of the regions 122 between partitions 120. Wafer 100, with its two partitions 120, may function similarly to a half cut solar cell configured similarly but requiring physical separation of cells rather than the illustrated embodiment's isolated partitions 120, for example. In some embodiments, individual wafers 100 (and/or other wafers described herein) may be incorporated into multi-cell panels.

Figure 2:
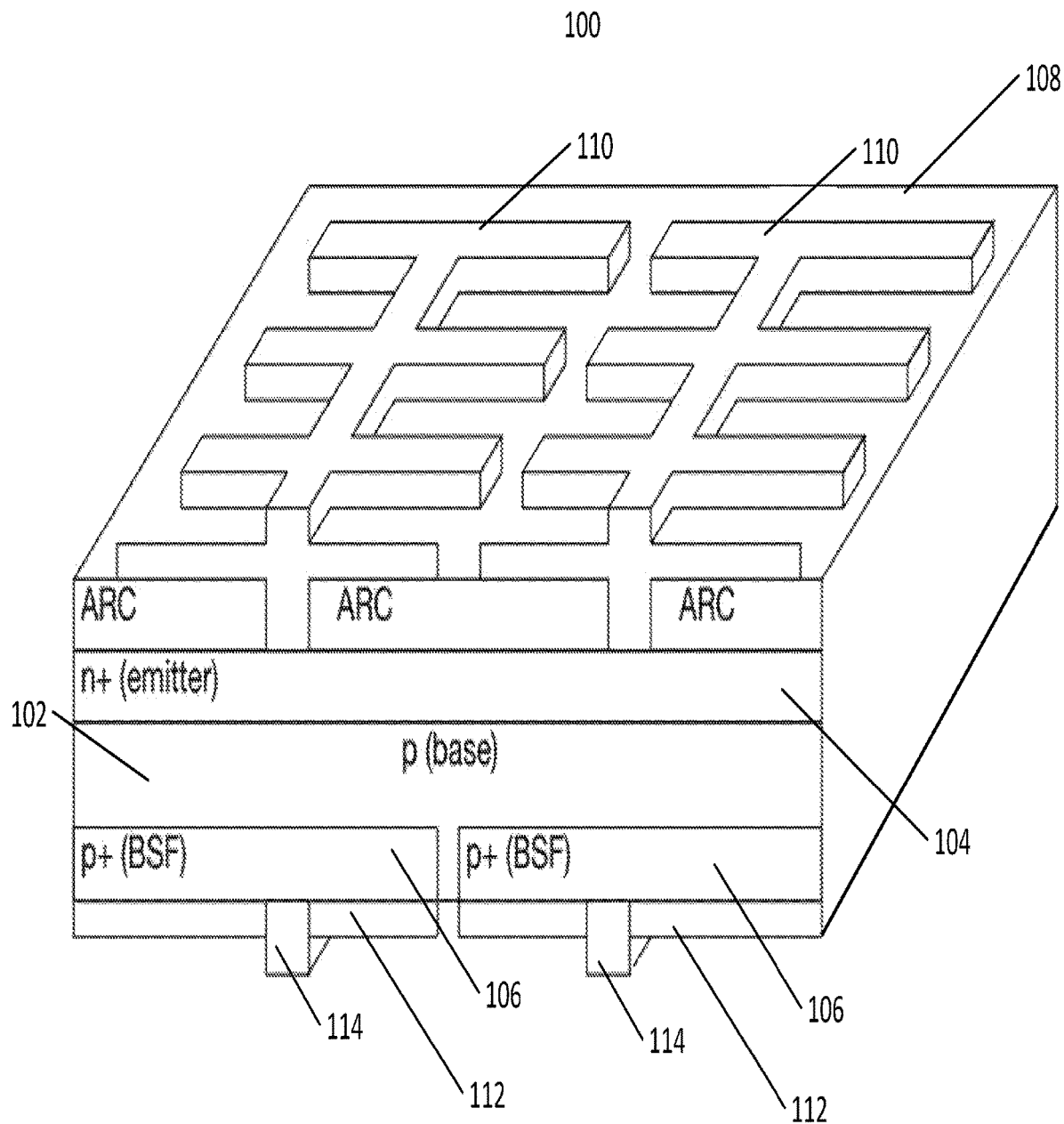
FIG. 2 is a perspective view of a semiconductor wafer with cell partitions according to an embodiment of the disclosure.

FIG. 2 shows a perspective view of wafer 100 with some reference numerals omitted for clarity. In the view of FIG. 2, it may be seen that front bus bars and/or front grid fingers 110 are separate from one another everywhere they appear on the surface of wafer 100. This may be true whether front bus bars and/or front grid fingers 110 have the illustrated configuration of FIG. 2 or whether front bus bars and/or front grid fingers 110 are arranged in any other configuration. In any case, front bus bars and/or front grid fingers 110 may be arranged to be separate from one another and to align with separate back surface field regions 106 to form separate partitions.

The production and manufacturing of photovoltaic cells utilizing the disclosed technology may be compatible with many semiconductor photovoltaic cell designs. For example, the embodiments shown in FIGS. 1 and 2 include emitter 104 as a continuous doped layer across the entire surface with back surface field regions 106 and back contacts 112 partitioned. A possible manufacturing practice for back surface field region 106 formation may include high temperature processing of an aluminum metal layer melted into the silicon surface forming an aluminum silicon eutectic region. The physical separation of back surface field regions 106 may be a result of the processing used and may not be a requirement for electrical partitioning in some embodiments.

Figure 9:
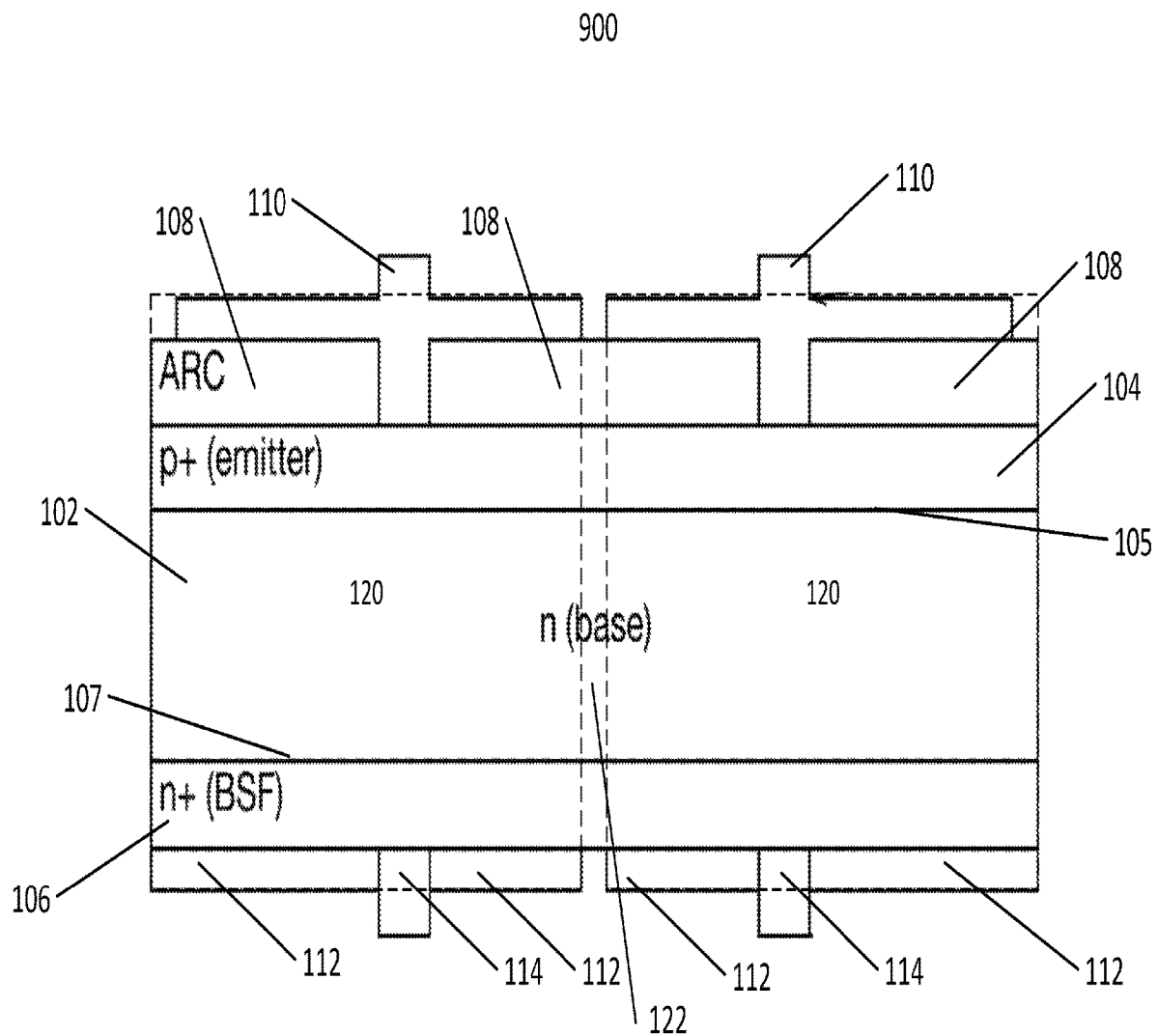
FIG. 9 is a cross-sectional view of a semiconductor wafer with cell partitions according to an embodiment of the disclosure.

In some embodiments, back surface field region 106 may be continuous or partitioned. FIG. 9 shows an example wafer 100 with a continuous back surface field region 106 realized by using a bifacial photovoltaic cell design with a continuous boron doped p-type region 104 and a continuous phosphorus doped n-type region 106 but partitioned by physically separate metal contacts on both the p-type doping and n-type doping regions (e.g., contacts 110 and 114, respectively. The spacing between the metal contacts 110/114 may establish a wafer partition resistance used to electrically partition a semiconductor wafer, a wafer partition resistance, $R_{wp}$. Partitions may be created without using a laser scribing tool and/or masking with compatible doping techniques. One embodiment of the configurable current cell with desired partitions may be created using screen printing masking to physically separate the metal contacts 110/114 within a partition for the n-type and p-type region.

In some examples, the production flow used for aluminum back surface field (Al-BSF) photovoltaic (PV) cells and/or passivated emitter and rear contact (PERC) PV cells and/or heterojunction technology (HJT) PV cells, etc. may be adapted, modified, and/or upgraded to produce wafers 100 such as those described herein. The design, production, and/or manufacturing of the disclosed technology may be compatible with standard and/or existing production and manufacturing lines. The wafers 100 may be produced and/or manufactured on a post-production basis for many existing production lines. To create a wafer 100 from an existing PV cell production line, additional and/or less equipment, equipment upgrades, and/or modification of processes/steps may be implemented. The ability to create localized doping that may be needed to create the partitions for a PV cell may be accomplished by adding new equipment or upgrading existing equipment to etch, dope, mask, and/or print the semiconductor wafer/substrate, for example. The etching may be accomplished by laser, chemical etching, plasma etching, scribing, etc. The doping may be accomplished by laser doping, ion implantation with or without masking, epitaxial growth with or without masking, furnace diffusion with/without masking, chemical vapor deposition (CVD) with or without masking, low pressure chemical vapor deposition (LPCVD) with or without masking, screen printing, etc. The masking may be accomplished by photolithography, screen printing, shadow mask, etc. The screen printing may be accomplished by changing the design of the screen to match the desired partition(s) configuration.

For example, the aluminum back surface field photovoltaic cell may be created using a production line for Al-BSF PV cell fabrication. The disclosed technology may be produced on the production line with or without the addition of a laser tool that may be configured to etch a 2-dimensional pattern commensurate with the desired partition design. The laser tool may be used to scribe/etch the back surface field region to a depth exposing the base/bulk doping and may achieve the semi-electrical isolation of the pp+ junction. For example, such processing may be used to process a wafer without partitions 120 into wafer 100 of FIG. 1. A partition of the Al-BSF cell may include an aluminum back surface field region 106 and corresponding aluminum metal layer 112 that may be separated from a second aluminum back surface field region 106 and corresponding aluminum metal layer 112 by the base semiconductor and/or air and/or insulator 122. The additional laser scribing tool may be inserted at multiple points in the process flow and/or manufacturing process including, but not limited to, before/after the test/sort step, the metal screen printing step, the phosphorus glass removal step, and/or after the emitter doping step, etc.

The production and/or manufacturing of wafers 100 may be implemented to provide tester/sorter step compatibility with a parallel configuration using other solar cell technology. Utilizing some embodiments of the disclosed technology, existing manufacturing techniques and production line(s) may be upgraded and/or retrofitted and/or reconfigured to utilize up to 100% of the existing production and/or manufacturing equipment and/or production lines and/or production processes. In order to enable the disclosed technology, simple and low cost changes may be utilized.

For example, some embodiments may allow for the consolidation of process steps used to change a base substrate into a PV cell, such as the consolidation of screen printed steps. In some embodiments, the steps to complete a photovoltaic panel may be consolidated in the PV cell process. For example, a stringer/tabber step may be used by a photovoltaic panel manufacturer to interconnect crystalline silicon PV cells. One embodiment of the technology may allow flexibility in the interconnection step that may be accomplished by screen printing during the PV cell processing. The number of screen printing steps may remain the same/increase/decrease but may allow for module process step simplification. For example, an aluminum back surface field PV cell may have a front screen printed silver step, a back screen printed silver step, and a back screen printed aluminum step but, with the disclosed technology, the three screen printing steps may only have one front silver screen printing step and one back aluminum screen printed step that may allow for the connection of some of the front silver to the back aluminum screen printed metal along the edge of the wafer/substrate.

Figure 3:
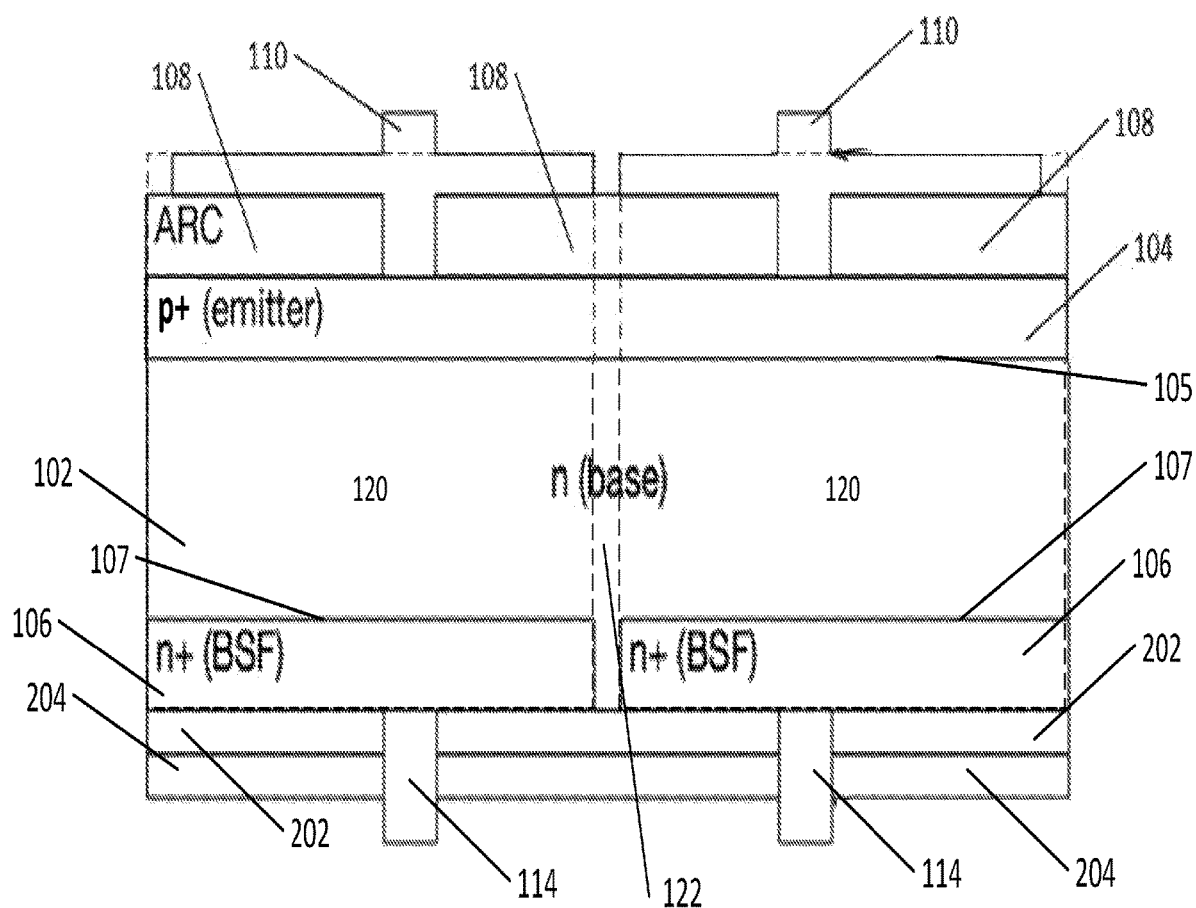
FIG. 3 is a cross-sectional view of a semiconductor wafer with cell partitions according to an embodiment of the disclosure.

Another example of the disclosed technology may be implemented on a bifacial photovoltaic cell that may use boron, aluminum, and/or phosphorus, etc. doping and may be created with the addition of masking and/or etching process steps. FIG. 3 is a cross-sectional view of a semiconductor wafer 200 with cell partitions 120 according to an embodiment of the disclosure. Wafer 200 may be a bifacial PV cell fabricated on a n-type crystalline silicon wafer/substrate 120 with a phosphorus-doped back surface field region 106, a boron-doped emitter region 104, back surface passivation 202, and back capping layer 204. In some embodiments, partitions 120 may be created with different wafer partition resistance by using a laser scribing tool and/or other scribing system/method and/or masking with compatible doping techniques to create localized doping regions to adjust the wafer partition resistance. The masking technique used in conjunction with the doping technique to create partitions 120 may be accomplished by photolithography, shadow mask, screen printing, inkjet, etc. The doping technique used in conjunction with the masking step and the separated front bus bars and/or front grid fingers 110 may adjust the desired wafer partition resistance between partitions 120.

In embodiments implemented on a bifacial photovoltaic cell, doping may be used to create partitions for a bifacial wafer. For example, doping may be accomplished in conventional furnace diffusion by first adding a protective diffusion mask for boron doping or phosphorus doping, such as a thermal SiO2 layer, that may be subsequently processed by the application of a screen printed chemical mask with the partition design. A chemical etching step may be used to remove unwanted SiO2 that may have covered the desired regions for the boron emitter or phosphorus back surface field. The etching step may be followed by a high temperature boron or phosphorus diffusion step. The diffusion step may be followed by the removal of the masking layers and/or diffusion glass. The masked regions may serve as a diffusion barrier to the boron or phosphorus during the high temperature processing and the unmasked regions may be boron or phosphorus doped. In some embodiments, a phosphorus-doped back surface field region 106 may need an additional masking step to protect the boron emitter characteristics and eliminate/reduce cross doping during phosphorus processing.

Figure 4:
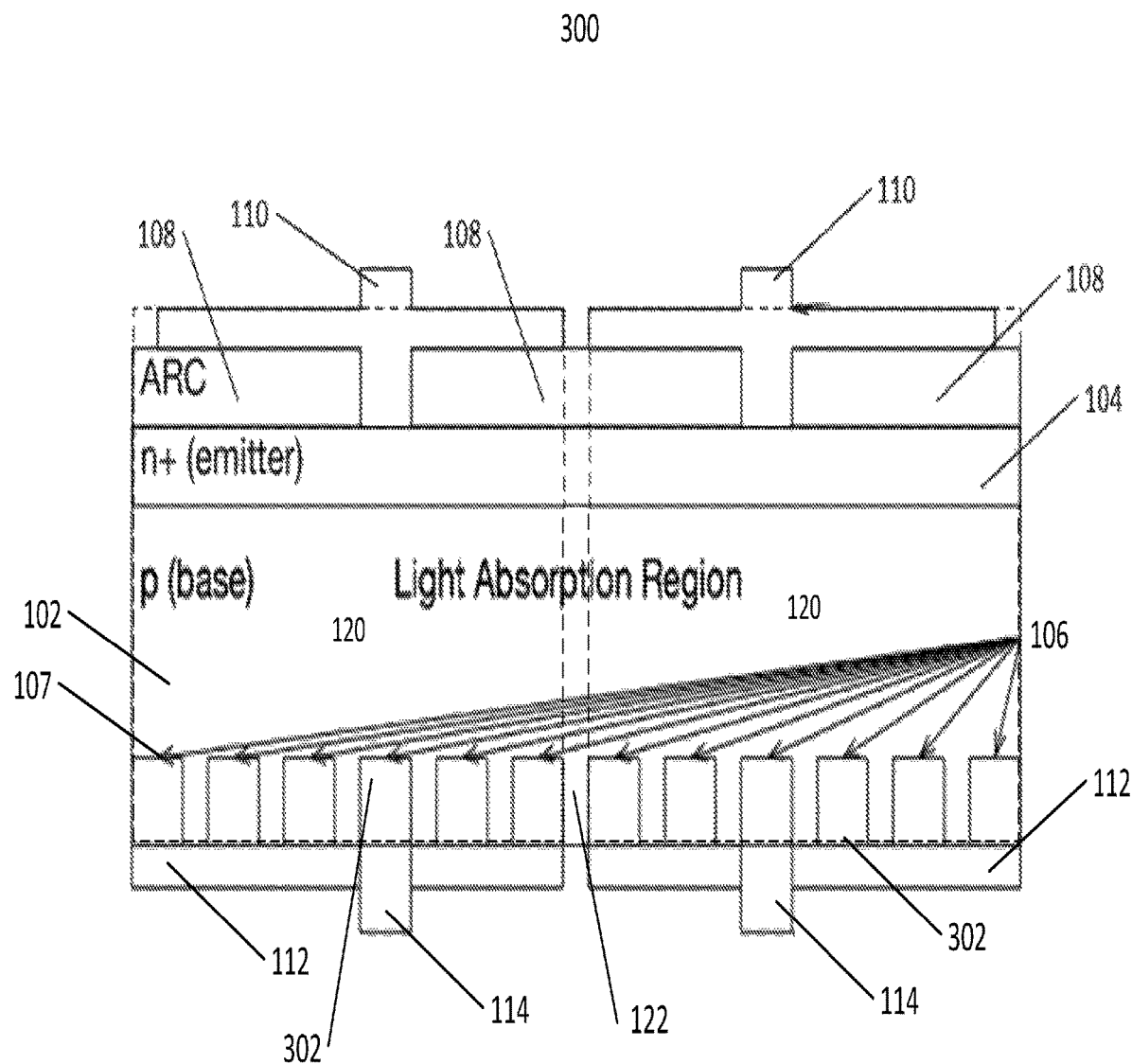
FIG. 4 is a cross-sectional view of a semiconductor wafer with cell partitions using passivated emitter and rear contact (PERC) photovoltaic cell technology according to an embodiment of the disclosure.

Another embodiment of the disclosed technology may be implemented using passivated emitter and rear contact (PERC) photovoltaic cell technology. FIG. 4 is a cross-sectional view of a semiconductor wafer 300 with cell partitions 120 using PERC technology according to an embodiment of the disclosure. Wafer 300 may be similar to wafer 100 except that wafer 300 may include segmented localized back surface field regions 302 comprising a plurality of electrically separate high low junctions 107 per partition 120. A partition 120 of wafer 300 may include a front bus bar and/or front grid fingers 110 that may be separated from a second front bus bar and/or second front grid fingers 110. The localized aluminum back surface field region 302 may be separated from a second localized aluminum back surface field region 302 by the base semiconductor and/or air and/or insulator 122. The localized back surface field 302 and the aluminum metal layer 112 used to form the localized back surface field 302 may align with front bus bars and/or front grid fingers 110 to form the desired partitions 120.

Figure 5:
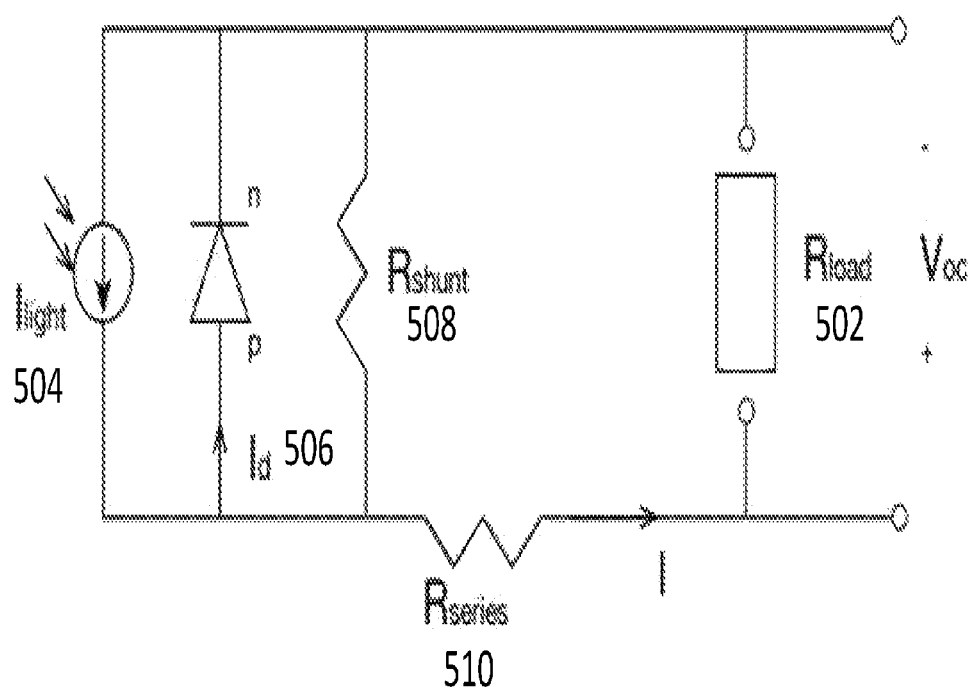
FIG. 5 is an equivalent circuit model for a solar cell configured according to the embodiment of FIG. 1.

FIG. 5 is an equivalent circuit model for a partition 120 of a solar cell configured according to the embodiment of FIG. 1. For example, circuit 500 of FIG. 5 may represent the result of connecting a single partition 120 directly to load 502. Partition 120 may behave similarly to a standard PV cell as known in the art, wherein current source 504 (e.g., caused by light incident on panel 100) may be arranged in parallel with diode 506 and shunt resistance 508. The current produced by partition 120 may be equal to that produced by current source 504, minus that which flows through diode 506, minus that which flows through shunt resistance 508. Voltage across load 502 may be derived based on the current and series resistance 510.

Figure 6:
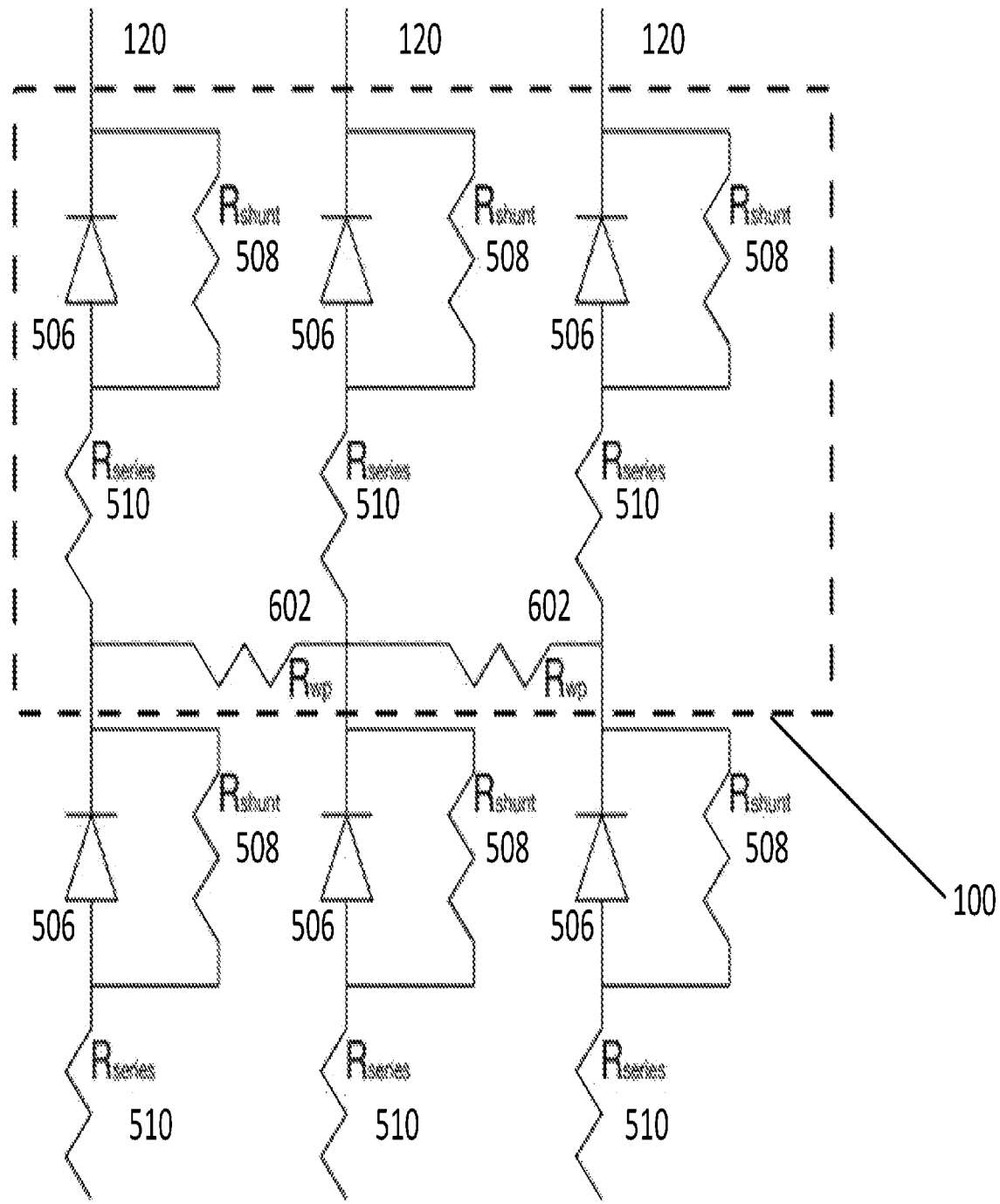
FIG. 6 is an equivalent circuit model for a plurality of parallel solar cells configured according to the embodiment of FIG. 1.

Given that wafer 100 may include several partitions 120, circuit 500 may be expanded upon when partitions 120 are used together. For example, FIG. 6 is an equivalent circuit model for a plurality of parallel solar cells configured according to the embodiment of FIG. 1. In circuit 600 of FIG. 6, a plurality of partitions 120 of a single wafer 100 (three in this example) may be arranged in parallel with one another. Each partition 120 may be configured according to the standard circuit model (e.g., circuit 500). The parallel partitions 120 may be coupled in series with other solar circuits (e.g., two three-partition wafers 100 may be wired in series such that each individual partition 120 of a given wafer 100 is in parallel with other partitions 120 of the same wafer 100). Partition resistance 602 in a parallel connected circuit may add a new electrical current path compared to a photovoltaic circuit with physically isolated cells connected in parallel. Partition resistance 602 may establish an alternative electrical path with a higher resistance between partitions 120 but still may allow for electrical current flow between partitions 120 within wafer 100. In some embodiments, partition resistance 602 may be adjusted to suit an application. Partition resistance 602 may be adjusted by various methods including, but not limited to, increasing the distance between metal contacts, altering the doping concentration of the underlying semiconductor layer, scribing, etc.

Figure 7:
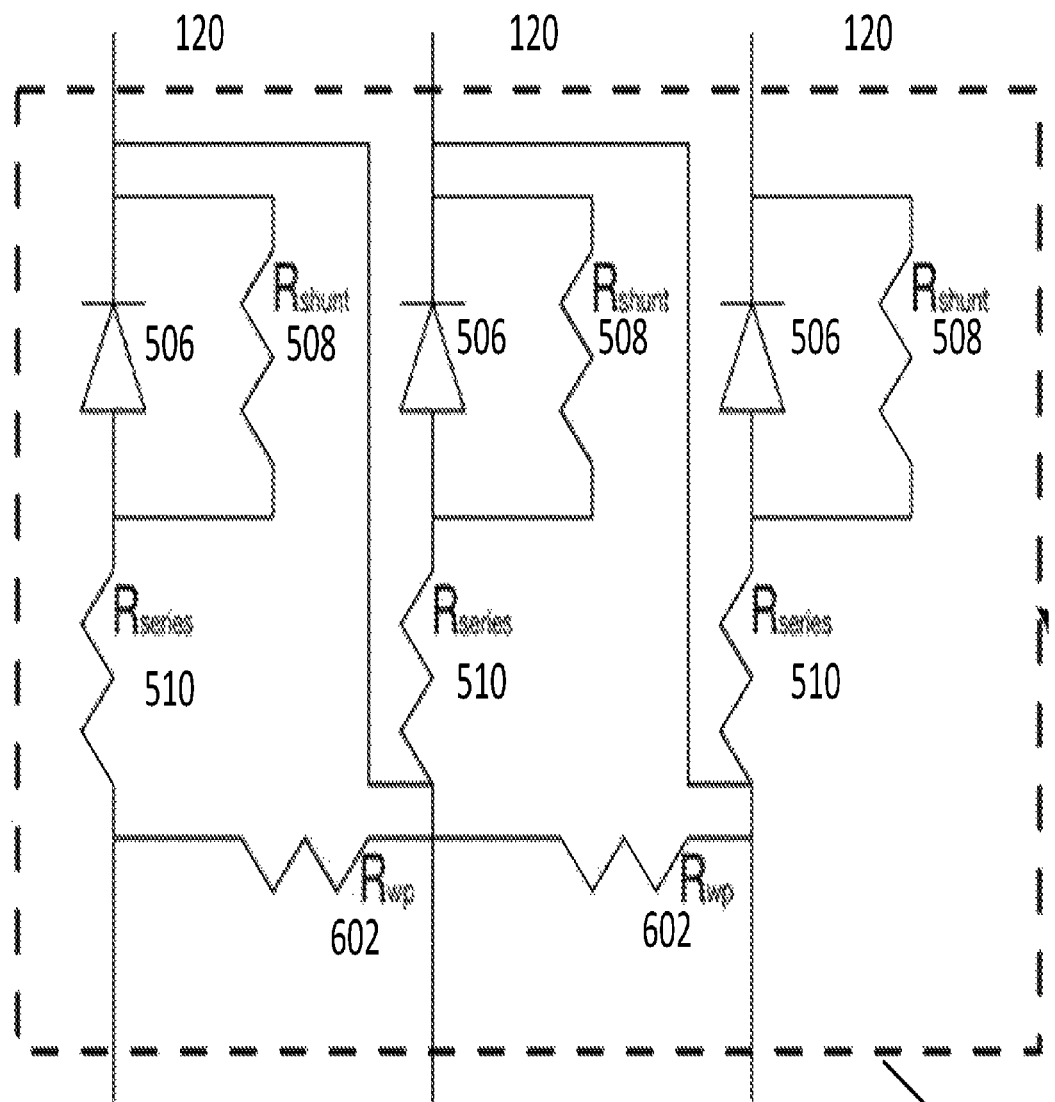
FIG. 7 is an equivalent circuit model for a plurality of parallel solar cells configured according to the embodiment of FIG. 1.

FIG. 7 is an equivalent circuit model for a plurality of partitioned solar cells configured according to the embodiment of FIG. 1 in a series circuit. In circuit 700 of FIG. 7, a plurality of partitions 120 of a single wafer 100 (three in this example) may be arranged in series with one another. Each partition 120 may be configured according to a modified version of the standard circuit model where shunt resistance 508 and partition resistance 602 are parallel to each other. Two resistors in parallel may lower the equivalent resistance. A lower equivalent resistance for the shunt resistance of a photovoltaic cell may reduce the cell efficiency. Some embodiments may adjust partition resistance 602 for suitable circuit performance.

The disclosed technology may be applied to photovoltaic cell technology including, but not limited to, crystalline silicon technologies such Aluminum Back Surface Field (Al-BSF), Passivated Emitter and Rear Contact (PERC), Bifacial, Heterojunction Technology (HJT), Interdigitated Back Contact (IBC), Emitter Wrap Through (EWT), etc.

The disclosed technology may be applicable across various substrates that may be used/partially used as a light absorption layer/region. First generation photovoltaic cells may be considered semiconductor wafer based technologies. The examples provided herein for reference or clarification often cite the use of crystalline silicon wafers as the base substrate used in a photovoltaic cell. However, the disclosed technology may be applicable to, and compatible with, a wide variety of semiconductor materials as the base material including, but not limited to, crystalline Si, multi-crystalline silicon, mono-crystalline silicon, mono-like crystalline silicon, Ge, SiGe, amorphous silicon, so called III-V semiconductor materials, II-VI materials, amorphous silicon, SiC, etc.

The disclosed technology may improve the flexibility in designing the size, shape, and thickness used to fabricate photovoltaic devices. By configuring the power characteristics associated with a particular semiconductor wafer/substrate, as disclosed herein, it may be possible to increase and/or decrease the length, width, and thickness of the substrate. Additionally, some embodiments may allow for the creation of semiconductor wafer/substrates of irregular shapes and sizes that have configurable power characteristics. For example, the following embodiments illustrate example features made possible through creating semiconductor wafer(s)/substrate(s) with configurable power characteristics that vary from industry standard 5 and/or 6 inch square/pseudo square wafers.

Figure 8A:
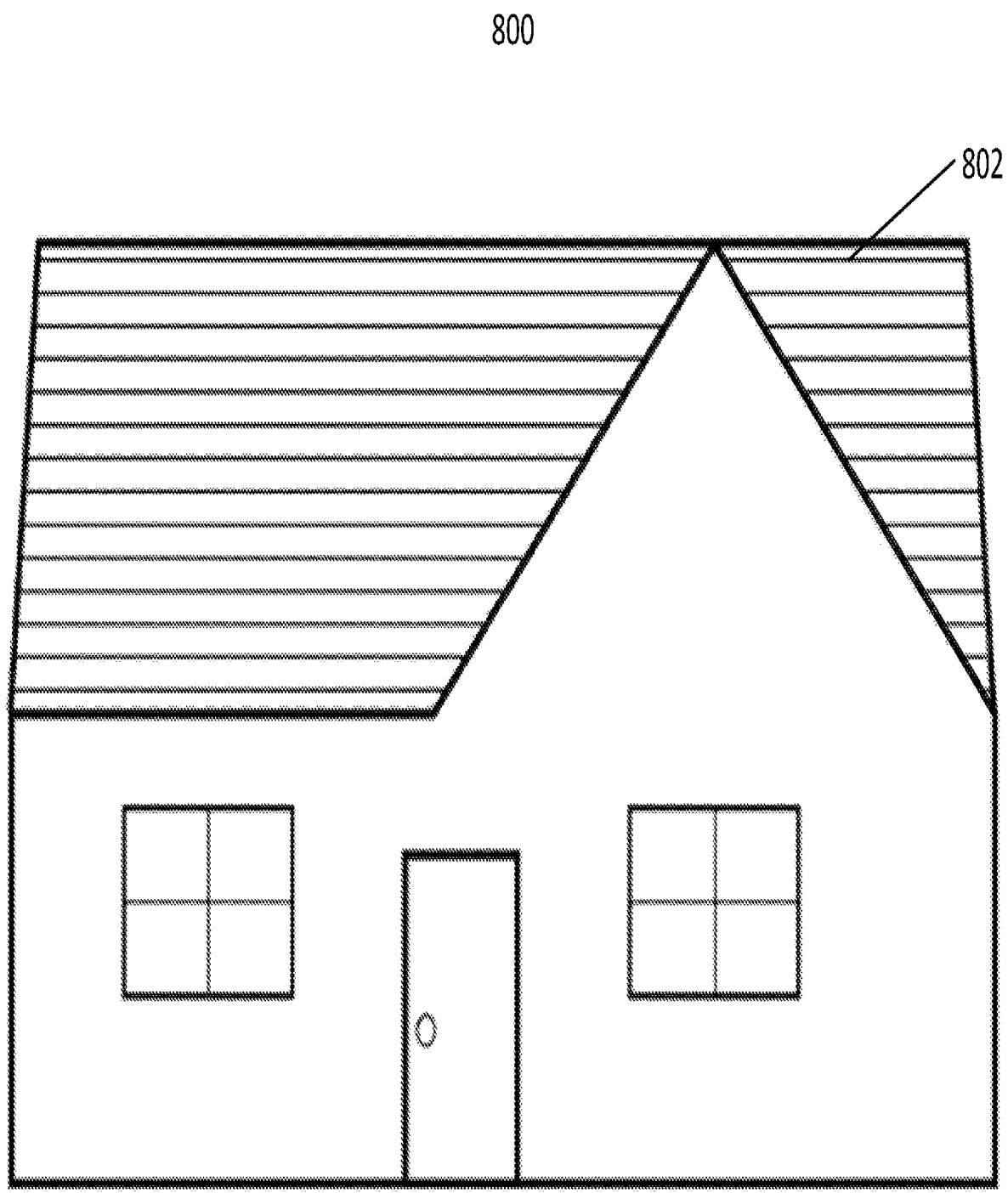
FIGS. 8A and 8B show a structure according to an embodiment of the disclosure.
Figure 8B:
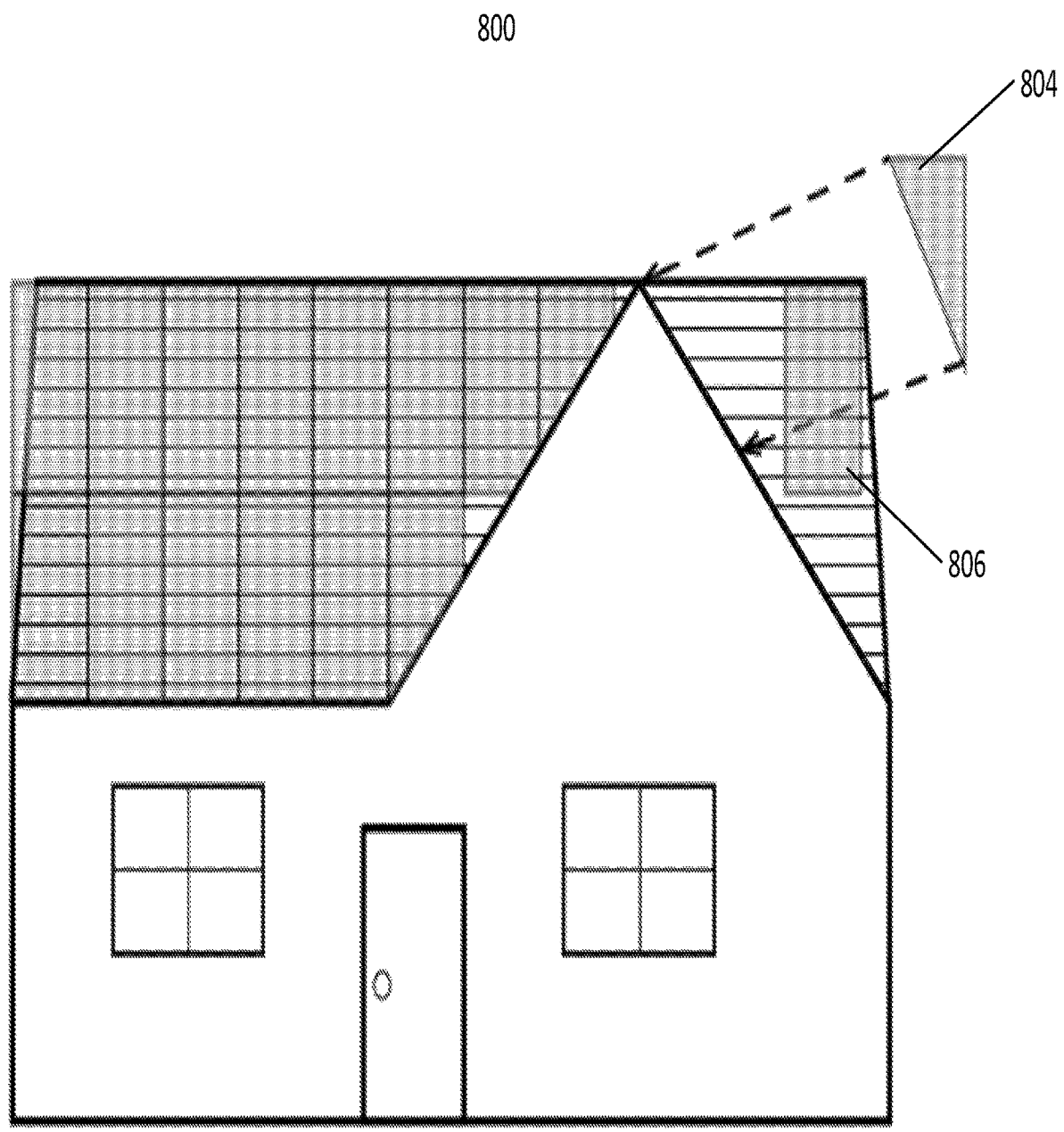

One example embodiment may enable configurable power characteristics on wafers of any shape and/or size. By configuring a multitude of partitions, in series and/or parallel, on any shape/size wafer, the disclosed technology may enable the configuration of power characteristics such that they match the power characteristics of standard PV cells and/or partitions 120 of wafer 100. For example, the disclosed technology may enable an installer of residential roof top photovoltaic panels/modules to cover additional roof surface area(s) that are irregular size or shape. FIGS. 8A and 8B show a structure 800 according to an embodiment of the disclosure. Structure 800 may include roof 802 with a non-rectangular surface area. Irregular shaped photovoltaic cells and/or photovoltaic panels 804 may provide complete coverage and an aesthetically pleasing appearance. Wafers/panels configured according to the embodiments described herein may have irregular shapes and/or may be configured to have power characteristics matching the power requirements of adjacent panels 806 and/or standard cells and/or wafers 100. In some embodiments, disclosed photovoltaic panels may fill the maximum available space on small, non-uniform surfaces like automobiles and spacecraft while supporting desired power characteristics.

The disclosed technology may reduce/limit power (I2R) loss. For example, the amount of I2R loss and/or heat loss for a standard 60 cell photovoltaic panel may be approximately 8 Watts when the output current is 9 amps. The heat loss may then follow PLoss=I2R, where 8 Watts=81R. Therefore, the resistance of the system, R, is 0.1 ohms. One embodiment of the disclosed technology may configure partitions in parallel to produce desirable power characteristics. Thus, one circuit may be divided into two parallel distinct circuits with one half the current of the original, yielding 2*PLoss=(4.5 amps)^2*(0.1 ohms)=4 Watts. This may represent a reduction of loss of approximately 4 Watts for an approximately 300 Watt panel. Additionally, this embodiment may reduce the size of the wire/conductor required to connect/interconnect wafer 100 and/or other semiconductor wafers.

The aforementioned wafers (e.g., wafer 100) may be formed into panels. A collection of connected standard PV cells and/or partitions 120 of wafer 100 may come in various sizes and shapes and can be referred to as photovoltaic panels, solar panels, solar modules, or photovoltaic modules (hereafter referred to as "panels"). One embodiment of the technology may be a single wafer 100 encapsulated into a panel. The disclosed technology may enable configurable power characteristics of a single wafer 100 panel.

Some embodiments may provide configurable power characteristics on panels of any shape and/or size. By configuring a multitude of partitions, in series and/or parallel, of any shape/size wafer 100 panel, the disclosed technology may enable the creation of power characteristics such that they match the power characteristics of standard PV cells and/or partitions 120 of wafer 100. For example, the disclosed technology may enable an installer of residential rooftop photovoltaic panels/modules to cover additional roof surface area(s) that are irregular in size or shape (e.g., as illustrated in FIGS. 8A-8B and described above). Another example may allow photovoltaic panels to fill the maximum available space on small, non-uniform surfaces like automobiles and spacecraft while supporting desired power characteristics and/or series/parallel configuration. One embodiment of the disclosed technology may enable the creation of a single wafer with dimensions of 1 meter by 1.6 meters with a multiplicity of partitions, for example.

In some embodiments, panels may include multiple wafers 100. The disclosed technology may enable flexibility in the design and configuration of parallel connection(s) of two or more wafers 100, and/or standard PV cells. The disclosed technology may enable configurable power characteristics of each wafer 100 and flexibility based on parallel connection(s) to create desired power characteristics and performance of the panel.

While various embodiments have been described above, it should be understood that they have been presented by way of example and not limitation. It will be apparent to persons skilled in the relevant art(s) that various changes in form and detail can be made therein without departing from the spirit and scope. In fact, after reading the above description, it will be apparent to one skilled in the relevant art(s) how to implement alternative embodiments. For example, other steps may be provided, or steps may be eliminated, from the described flows, and other components may be added to, or removed from, the described systems. Accordingly, other implementations are within the scope of the following claims.

In addition, it should be understood that any figures which highlight the functionality and advantages are presented for example purposes only. The disclosed methodology and system are each sufficiently flexible and configurable such that they may be utilized in ways other than that shown.

Although the term "at least one" may often be used in the specification, claims and drawings, the terms "a", "an", "the", "said", etc. also signify "at least one" or "the at least one" in the specification, claims and drawings.

Finally, it is the applicant's intent that only claims that include the express language "means for" or "step for" be interpreted under 35 U.S.C. 112(f). Claims that do not expressly include the phrase "means for" or "step for" are not to be interpreted under 35 U.S.C. 112(f).

The invention claimed is:
1. A system of photovoltaic devices comprising:
a wafer comprising:
a continuous base semiconducting region having a constant conductivity throughout and having a majority charge carrier, wherein the continuous base semiconducting region extends in a plane;
a first physically contiguous semiconducting region in contact with the continuous base semiconducting region, wherein the first physically contiguous semiconducting region is doped so as to have an oppositely charged majority charge carrier as the continuous base semiconducting region, wherein the first physically contiguous semiconducting region extends parallel to the plane;
a second physically contiguous semiconducting region in contact with the continuous base semiconducting region, wherein the second physically contiguous semiconducting region is doped to share the majority type carrier with the continuous base semiconducting region, wherein the second physically contiguous semiconducting region has a larger majority carrier concentration than the continuous base semiconducting region, wherein the second physically contiguous semiconducting region extends parallel to the plane;

wherein a first photovoltaic device is formed on the wafer by:
a first portion of the continuous base semiconducting region;
a first portion of the first physically contiguous semiconducting region;
a first portion of the second physically contiguous semiconducting region;
and further includes:
a first conductive layer in electrical contact with the first portion of the first physically contiguous semiconducting region;
a second conductive layer in electrical contact with the first portion of the second physically contiguous semiconducting region,
and wherein a second photovoltaic device is formed on the wafer by:
a second portion of the continuous base semiconducting region;
a second portion of the first physically contiguous semiconducting region;
a second portion of the second physically contiguous semiconducting region;
and further includes:
a third conductive layer in electrical contact with the second portion of the first physically contiguous semiconducting region;
a fourth conductive layer in electrical contact with the second portion of the second physically contiguous semiconducting region; and
wherein the first conductive layer and the third conductive layer are separated from each other by a first width so that the first conductive layer and the third conductive layer are not in direct physical contact;
wherein the second conductive layer and the fourth conductive layer are separated from each other by a second width so that the second conductive layer and the fourth conductive layer are not in direct physical contact; and
an interconnect connecting the first conductive layer with the fourth conductive layer.

2. The system of claim 1, wherein at least one of the first semiconducting region or the second semiconducting region comprises a doped region of the base semiconducting region.

3. The system of claim 1, wherein at least one of the first semiconducting region or the second semiconducting region comprises an epitaxially grown layer on the base semiconducting region.

4. The system of claim 1, wherein at least one of the first semiconducting region or the second semiconducting region comprises a deposited doped layer on the base semiconducting region.

5. The system of claim 1, further comprising at least one coating covering at least a portion of the first semiconducting region.

6. The system of claim 1, wherein at least one of the first, second, third, or fourth conductive layers comprises aluminum.

7. A system of photovoltaic devices comprising:
a wafer comprising:
a continuous base semiconducting region having a constant conductivity throughout and having a majority charge carrier, wherein the continuous base semiconducting region extends in a plane;
a first physically contiguous semiconducting region in contact with the continuous base semiconducting region, wherein the first physically contiguous semiconducting region is doped so as to have an oppositely charged majority charge carrier as the continuous base semiconducting region, wherein the first physically contiguous semiconducting region extends parallel to the plane;
at least two second physically contiguous semiconducting regions in contact with the continuous base semiconducting region, the at least two second physically contiguous semiconducting regions separated from one another by a first portion of the continuous base semiconducting region, wherein the at least two second physically contiguous semiconducting regions are doped to share the majority type carrier with the continuous base semiconducting region, wherein the at least two second physically contiguous semiconducting regions have a larger majority carrier concentration than the continuous base semiconducting region, wherein the at least two second physically contiguous semiconducting regions extend parallel to the plane;
wherein a first photovoltaic device is formed on the wafer by:
a second portion of the continuous base semiconducting region;
a first portion of the first physically contiguous semiconducting region;
the first of the at least two second physically contiguous semiconducting regions;
and further includes:
a first conductive layer in electrical contact with the first portion of the first physically contiguous semiconducting region;
a second conductive layer in electrical contact with the first of the at least two second physically contiguous semiconducting regions,
and wherein a second photovoltaic device is formed on the wafer by:
a third portion of the continuous base semiconducting region;
a second portion of the first physically contiguous semiconducting region;
the second of the at least two second physically contiguous semiconducting regions;
and further includes:
a third conductive layer in electrical contact with the second portion of the first physically contiguous semiconducting region;
a fourth conductive layer in electrical contact with the second of the at least two second physically contiguous semiconducting regions; and
wherein the first conductive layer and the third conductive layer are separated from each other by a first width so that the first conductive layer and the third conductive layer are not in direct physical contact;
wherein the second conductive layer and the fourth conductive layer are separated from each other by a second width so that the second conductive layer and the fourth conductive layer are not in direct physical contact; and
an interconnect connecting the first conductive layer with the fourth conductive layer.

8. The system of claim 7, wherein at least one of the first semiconducting region or either of the at least two second semiconducting regions comprises a doped region of the base semiconducting region.

9. The system of claim 7, wherein at least one of the first semiconducting region or either of the at least two second semiconducting regions comprises an epitaxially grown layer on the base semiconducting region.

10. The system of claim 7, wherein at least one of the first semiconducting region or either of the at least two the second semiconducting regions comprises a deposited doped layer on the base semiconducting region.

11. The system of claim 7, further comprising at least one coating covering at least a portion of the first semiconducting region.

12. The system of claim 7, wherein at least one of the first, second, third, or fourth conductive layers comprises aluminum.

13. A system of photovoltaic devices comprising:
a plurality of wafers, each wafer of the plurality of wafers comprising:
   a continuous base semiconducting region having a constant conductivity throughout and having a majority charge carrier;
   a first physically contiguous semiconducting region in contact with the continuous base semiconducting region, wherein the first physically contiguous semiconducting region is doped so as to have an oppositely charged majority charge carrier as the continuous base semiconducting region;
   a second physically contiguous semiconducting region in contact with the continuous base semiconducting region, wherein the second physically contiguous semiconducting region is doped to share the majority type carrier with the continuous base semiconducting region, wherein the second physically contiguous semiconducting region has a larger majority carrier concentration than the continuous base semiconducting region;
wherein a first photovoltaic device is formed on the wafer by:
   a first portion of the continuous base semiconducting region;
   a first portion of the first physically contiguous semiconducting region;
   a first portion of the second physically contiguous semiconducting region;
   and further includes:
      a first conductive layer in electrical contact with the first portion of the first physically contiguous semiconducting region;
      a second conductive layer in electrical contact with the first portion of the second physically contiguous semiconducting region,
and wherein a second photovoltaic device is formed on the wafer by:
   a second portion of the continuous base semiconducting region;
   a second portion of the first physically contiguous semiconducting region;
   a second portion of the second physically contiguous semiconducting region;
   and further includes:
      a third conductive layer in electrical contact with the second portion of the first physically contiguous semiconducting region;
      a fourth conductive layer in electrical contact with the second portion of the second physically contiguous semiconducting region; and
wherein the first conductive layer and the third conductive layer are separated from each other by a first width so that the first conductive layer and the third conductive layer are not in direct physical contact;
wherein the second conductive layer and the fourth conductive layer are separated from each other by a second width so that the second conductive layer and the fourth conductive layer are not in direct physical contact;
a first interconnect, wherein the first interconnect connects the first conductive layer on a first wafer of the plurality of wafers with the second conductive layer on a second wafer of the plurality of wafers; and
a second interconnect, wherein the second interconnect connects the third conductive layer on the first wafer with the fourth conductive layer on the second wafer.

14. The system of claim 13, wherein at least one of the first semiconducting region or the second semiconducting region comprises a doped region of the base semiconducting region.

15. The system of claim 13, wherein at least one of the first semiconducting region or the second semiconducting region comprises an epitaxially grown layer on the base semiconducting region.

16. The system of claim 13, wherein at least one of the first semiconducting region or the second semiconducting region comprises a deposited doped layer on the base semiconducting region.

17. The system of claim 13, further comprising at least one coating covering at least a portion of the first semiconducting region.

18. The system of claim 13, wherein at least one of the first, second, third, or fourth conductive layers comprises aluminum.

* * * * *